(12) United States Patent
Pelrine et al.

(10) Patent No.: US 8,975,888 B2
(45) Date of Patent: *Mar. 10, 2015

(54) MINIATURE HIGH-VOLTAGE POWER SUPPLIES

(75) Inventors: Ronald E. Pelrine, Longmont, CO (US); Ilya Polyakov, San Francisco, CA (US)

(73) Assignees: SRI International, Menlo Park, CA (US); Parker-Hannifin Corporation, Cleveland, OH (US)

( * ) Notice: Subject to any disclaimer, the term of this patent is extended or adjusted under 35 U.S.C. 154(b) by 42 days.

This patent is subject to a terminal disclaimer.

(21) Appl. No.: 13/249,635

(22) Filed: Sep. 30, 2011

(65) Prior Publication Data

US 2012/0019223 A1 Jan. 26, 2012

Related U.S. Application Data

(62) Division of application No. 11/758,409, filed on Jun. 5, 2007, now Pat. No. 8,058,861.

(51) Int. Cl.
*H02M 3/156* (2006.01)
*H04N 5/222* (2006.01)

(52) U.S. Cl.
USPC ............. 323/288; 363/59; 359/230; 348/372

(58) Field of Classification Search
USPC ................. 323/232, 259, 288, 360; 359/230; 348/372
See application file for complete search history.

(56) References Cited

U.S. PATENT DOCUMENTS

| | | | |
|---|---|---|---|
| 4,598,338 A * | 7/1986 | Van Devender et al. ...... | 361/435 |
| 5,668,703 A | 9/1997 | Rossi et al. | |
| 5,896,287 A | 4/1999 | Mihara et al. | |
| 7,750,617 B2 * | 7/2010 | Omi .............................. | 323/285 |
| 8,004,339 B2 * | 8/2011 | Barrow ......................... | 327/333 |

\* cited by examiner

*Primary Examiner* — Jessica Han
(74) *Attorney, Agent, or Firm* — K&L Gates LLP

(57) ABSTRACT

The present invention provides miniature power supplies and circuitry for powering high-voltage devices.

20 Claims, 4 Drawing Sheets

MINIATURE HIGH-VOLTAGE POWER SUPPLIES

CROSS REFERENCE

The present application is a divisional of U.S. Ser. No. 11/758,409 filed on Jun. 5, 2007.

FIELD OF THE INVENTION

The present invention is related to very compact, low-power, high-voltage power supplies.

BACKGROUND

High-voltage power supplies are commonly used and well-known for powering devices which require a high DC voltage. Most high-voltage power supplies include a transformer or inductor for converting or stepping-up a relatively low DC source voltage to a relatively high DC output voltage. Components, such as the transformer or inductor, diodes, and capacitors used in high-voltage power supply circuits must be able to withstand the effects of high voltages and, thus, are often relatively large and heavy. In smaller and/or portable devices necessitating the use of a low DC voltage source, i.e., a battery supplying 5V or less, use of such large/heavy power components is prohibitive. Even where power supply size is not as much of an issue, where the high-voltage device being powered is mostly capacitive in nature, efficiently modulating the voltage across the capacitive device can be problematic. This is particularly the case with high-frequency (up to 10 kHz or more) capacitive devices, e.g., high-speed actuators, electronic displays, etc.

There are commonly known power circuit topologies which can be used in lieu of larger power components and also address the problem of high voltage modulation. One such topology approach is the cascading (series connection) of multiple transistor switch devices to reach a desired voltage rating. However, a significant number of parts must be added (as many as ten or more cascaded switch multipliers may be required) in addition to the main power devices, possibly including high voltage drive transformers with difficult isolation requirements. An additional concern for the modulation of high voltages in capacitive devices is that of power dissipation due to parasitic capacitances across the switching devices. In a fast switching circuit, this energy is dissipated in the transistor switch at every turn-on, and can result in a substantial amount of power dissipation. Power dissipation is particularly acute in high voltage circuits where losses due to high-frequency switching activity (commonly referred to as "switching loss") can quickly reach unacceptable levels. In addition to reducing efficiency, these losses can increase the temperature of the switching elements beyond their ratings, causing premature failure.

Converter topologies such as zero voltage switching (ZVS) and zero current switching (ZCS) address the problem of power dissipation due to switching loss; however, they have complex designs with a high part count, which adds to the size and cost of the power supply.

A boost converter is another type of high voltage power circuit topology which provides voltage gains in the range from about 20× to 50×. They are advantageous in that they are relatively small and compact; however, conventional boost converters do not fully address the problem of power dissipation due to switching losses. Additionally, because they employ high-impedance switching circuits, they are also subject to conduction losses. In order to obviate the conductive losses, additional circuitry is commonly incorporated, but at the sake of increasing the overall size and weight of the power supply.

Another common approach is to use larger switching devices that have significantly lower conduction losses, i.e., lower on-state resistance. This increases the size and cost of the power supply. Even where the high-voltage device being powered requires a relatively low supply voltage, i.e., less than about 2 kV, the components of conventional boost converters do not allow for much of a corresponding reduction in power supply size due to the additional circuitry required to mitigate the conductive losses. Nonetheless, boost circuits have been regarded as an optimal way in which to provide DC-DC voltage step-up. This is especially true for supplies where the ratio of output voltage to input voltage exceeds a factor of one hundred or more.

Other types of power circuit topologies are well-known and commonly-used to reduce the power dissipation which occurs through switching loss without greatly adding to the weight, size or mass of the power supply. One such circuit topology is a multi-stage voltage multiplier circuit which is coupled to the output side of the transformer or inductor. Another topology includes a flyback circuit. These circuits minimize conductive losses as they involve switches having very low resistance. While these circuit topologies reduce power dissipation and are not prohibitively large or heavy for use with smaller high-voltage devices, they are still too large and heavy to be provided in a form fit to accommodate miniature device applications, such as cell phone camera modules, camera flashes, etc.

Another approach to high voltage modulation involves coupling the transducer directly to a transformer. The transformer approach allows the high transducer voltage to be stepped down by the transformer turns ratio such that charging and discharging can be accomplished at low voltages. However, the size of the required transformer increases as the frequency of the charge/discharge cycle decreases. Thus, for the majority of applications in which weight, size and mass considerations are essential, the required transformer is unacceptably large.

One approach to reducing the size of the transformer or inductor (i.e., the magnetic components, generally) and, thus, the overall size and weight of the power supply in high-voltage applications, has been to use switching components having very high switching frequencies, i.e., in the range from about 200 kHz to 2 MHz. Of course, this approach presents the problem of power dissipation due to switching losses discussed above.

Notwithstanding the operational shortcomings of prior art power supplies, there are certain conventional power circuit topologies which enable relatively small power supply architectures. Examples of commercially available "miniature" DC-DC converters which employ one or more of the above approaches are as follows: EMCO High Voltage Corporation Q Series (Q50-5) converter supplying up to 5 kV output with an architecture having a volume of 0.125 in$^3$ (approximately 2,050 mm$^3$) and weighing 0.15 ounces (4.25 g); Gamma High Voltage Research, Inc. SM Series power supply supplying up to 3 kV and having an architecture volume of less than 1 in$^3$ (approximately 16,400 mm$^3$); Matsusada Precision, Inc. UP Series power supply with outputs from 100 to 500 V and having an architecture volume of 0.432 in$^3$ (approximately 7,080 mm$^3$) and AM Power Systems high voltage converters with outputs from 500 V to 5 kV and having an architecture volume of about 1 in$^3$ (approximately 16,400 mm$^3$) and weighing about 1 ounce (29 grams). While the sizes of these "miniature" power supplies are relatively small, the inventors hereof are not aware of an available power supply having an even smaller architecture, or one that could be scaled-down in size even with a substantially lower output voltage requirement, e.g., less than 2 kV.

In sum, prior art high-voltage power supply technology involves a tradeoff between size/weight and power dissipation due to switching losses. Thus, there continues to be an interest and need in developing high-voltage power supplies where size and weight efficiency is paramount without sacrificing power efficiency. As such, it would be highly beneficial to provide a high-voltage power supply made of extremely cost-effective, light-weight components which can realize ultra-miniature power supply architectures without the expected switching losses. Further, it would be highly advantageous to provide such a power circuitry topology which gives a manufacturer the flexibility in scaling the size of the power supply to the desired voltage output of the supply.

SUMMARY OF THE INVENTION

The present invention includes novel circuitry for powering devices requiring a high-voltage supply. The power circuitry of the present invention provides a novel circuit topology which utilizes extremely small and light-weight components which enable an ultra-miniature power supply architecture and which also minimize power dissipation due to switching losses. In particular, the novel power topology comprises high-resistance switching components. This is opposite to the approach taken with most power circuits of the prior art which employ low-resistance switches in order to minimize switching losses. Additionally, the switching components of the inventive circuitry are designed to operate at frequencies which are much lower than prior art power circuits without compromising the size of the circuit's magnetic components, i.e., inductor/transformer. This novel circuitry provides some unpredictable advantages which are explained in greater detail below.

In one variation, the subject power circuitry is configured to power a high-voltage capacitive load. In one embodiment thereof, the capacitive load is a very thin polymer film capacitor and, more particularly, is a transducer comprising a dielectric elastomer, also referred to as "electroactive polymer" (EAP). In a further embodiment, the EAP transducer is configured for positioning a miniature lens for use in a very small camera device, such as cell phone camera.

The present invention also provides power supplies comprising the subject power circuitry where the components thereof are relatively small and arranged in such a manner to reduce the number and size of the necessary components, thus reducing the overall space requirements and total cost of the power supply. Moreover, the subject power circuit topology provides a manufacturer with the flexibility of scaling the size of the power supply to the desired voltage output of the supply. More specifically, the subject topology allows scaling of the power supply size as power output requirements are lowered.

The present invention also includes methods for powering devices requiring a high-voltage supply, where the methods may be performed using the power circuitry or power supplies of the present invention. One such method involves charging and discharging the magnetic component of the power circuitry at a relatively high frequency.

While the subject circuits and methods may be employed with any high-voltage application, they are particularly suited for ultra-miniature devices.

These and other features, objects and advantages of the invention will become apparent to those persons skilled in the art upon reading the details of the invention as more fully described below.

BRIEF DESCRIPTION OF THE DRAWINGS

The invention is best understood from the following detailed description when read in conjunction with the accompanying schematic drawings. To facilitate understanding, the same reference numerals have been used (where practical) to designate similar elements that are common to the drawings. Included in the drawings are the following.

Variation of the invention from that shown in the figures is contemplated.

DETAILED DESCRIPTION OF THE INVENTION

The present invention provides power circuitry and power supplies for use in powering high-voltage devices where the available input voltage is relatively low and is required to be "stepped up" to a relatively high voltage to adequately power the device. While the subject invention may be employed with any high-voltage device, the invention is particularly described in the context of a device which provides a capacitive load. Still yet, for purposes of illustration only, the capacitive load used in the context of this description is a dielectric elastomer/electroactive polymer transducer, which is described in greater detail below.

Figure 1:
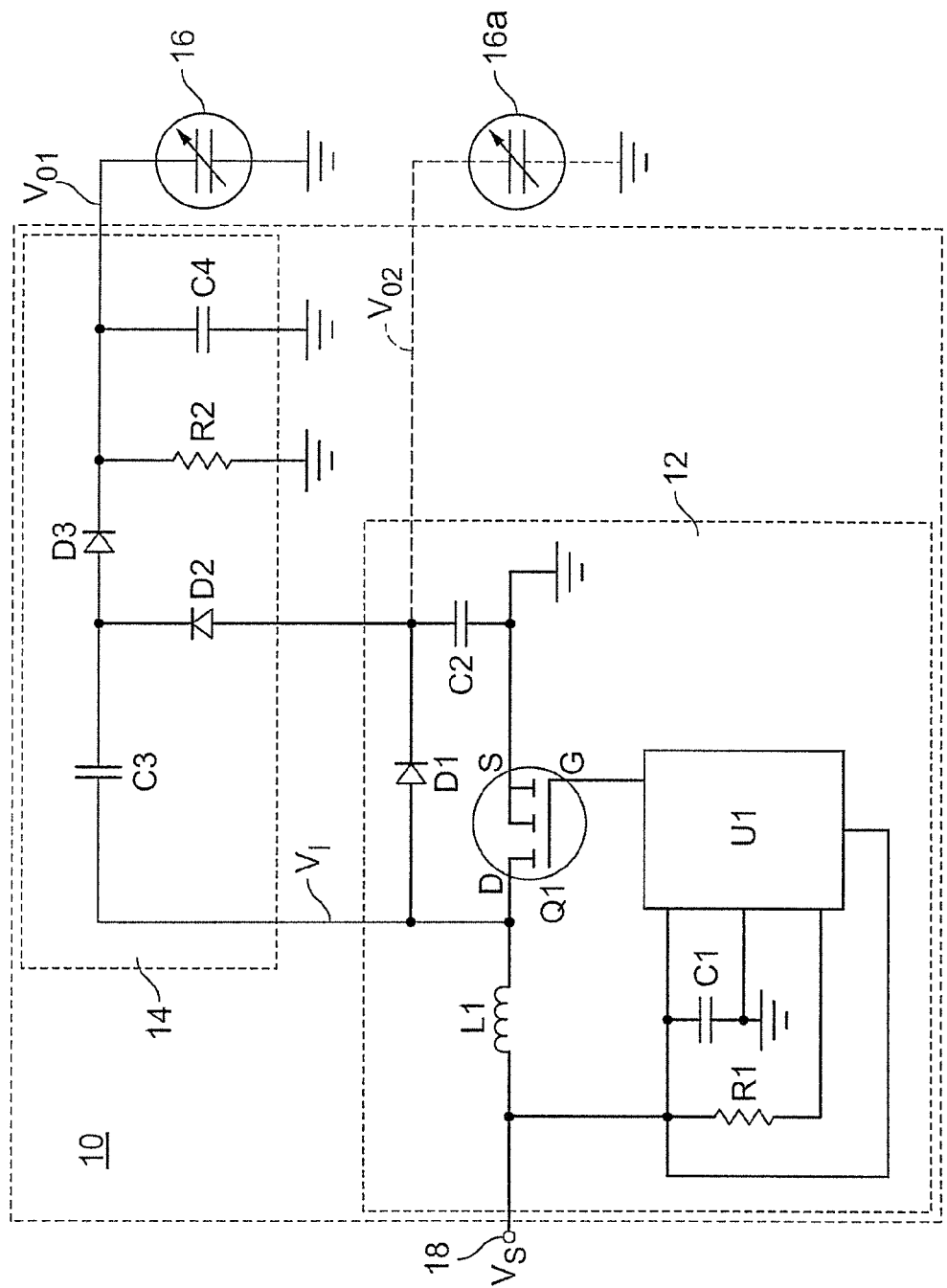
FIG. 1 is a block diagram and schematic representation of a power supply circuit of the present invention.

A general configuration of a power supply 10 of the present invention is provided in the block diagram of FIG. 1. In general, power supply 10 includes power circuit 12 and voltage multiplier circuit 14. Power circuit 12 has an input 18 coupled to a relatively low DC source signal $V_S$ (e.g., 2 to 5 volt range) and an output coupled to the input side of voltage multiplier circuit 14. Circuit 12, which functions similarly to a boost-type circuit, converts the DC source signal to a pulsed single-polarity signal $V_I$ having a very narrow pulse width while providing a voltage gain of greater than about 100×, and even as great as 250×, while still minimizing the overall power supply size, as is discussed in greater detail below. Of course, greater gains can be realized but with marginally larger architectures. Multiplier circuit 14, in turn, converts this pulsed voltage signal $V_I$ to a "stepped up" DC voltage output $V_O$ which is substantially proportional (multiplied by the number of stages) to the input voltage $V_I$. The number of "stages" employed by a multiplier circuit is selected to provide the desired output signal $V_O$. In the illustrated example, multiplier circuit 14 has two stages, often referred to as a "voltage doubler." Output voltage $V_{O1}$ is used to power a high-voltage device—here represented as a capacitive load 16.

In another variation of the present invention, the power supply does not include a multiplier circuit, with a single-stage, stepped-up DC voltage output (at $V_{O2}$) provided solely by power circuit 12. Power circuit 12 (with or without the elimination of capacitor C2) by itself can be an efficient charger for capacitive loads because the current-voltage output of power circuit 12 can match the charge state of a capacitive load better than many other types of charging circuits (i.e., at the onset of charging the load, it is desirable to charge it with relatively low voltage and high current, as compared to the nearly fully-charged state when the voltage is relatively high at a lower current). Of course, if a higher voltage output is required, any number of multiplier stages may also be used.

Power circuit 12 comprises inductor L1, transistor Q01, diode D1, capacitors C1 and C2, timing circuit comprised of oscillator U1 and resistor R1. A transformer may be employed as the magnetic component in lieu of the inductor if isolation between the circuit input and output is required or desired. For purposes of describing the operation of circuit 12, steady-state operation is assumed. The onset of conduction in switching transistor Q1 is caused by raising the gate-source voltage (i.e., across terminals G and S) at the beginning of a switching period. With transistor Q1 "on", the source voltage $V_S$ is applied across inductor L1. The orientation of diode D1 is such that diode D1 cannot conduct current while transistor Q1 is on. Transistor Q1 remains on for a period of time set by oscillator U1 and resistor R1, which collectively define the switching frequency of the transistor. At the end of this time period, the gate-source voltage of transistor Q1 is returned to zero, and transistor Q1 ceases to conduct current. When transistor Q1 is turned off, the voltage across inductor L1 rises, scaled up by the energy stored in the inductor. When the inductor voltage slightly exceeds the first stage voltage $V_{O2}$, diode D1 begins to conduct, enabling current to flow to the output and thereby transferring energy ($V_I$) previously stored in inductor L1 to the capacitor C2. Where no multiplier circuit is employed (and where capacitor C2 is eliminated from the power circuit when a capacitive load is being powered), this voltage ($V_{O2}$) is outputted to load 16a (shown in phantom). Meanwhile, in either case, diode D1 prevents the current from reversing direction. Thus, as energy is transferred to the output capacitor C2, or directly to load 16a in the latter configuration, the inductor L1 current decreases. When transistor Q1 turns on again, the process is repeated.

Multiplier circuit 14 is a voltage doubler, i.e., provides two stages, where capacitor C2 and diode D1 (of power circuit 12) collectively define the first stage, capacitor C3 and diode D2 collectively define the transfer stage and capacitor C4 and diode D3 collectively define the second stage. Resistor R2 is used to discharge (capacitive) load 16. The magnitude of $V_{O1}$ is obtained by adding the voltages across the two stages of circuit 14, i.e., 2X where X is the value of the magnitude of $V_I$.

The respective values of the capacitors, diodes and resistors of the power and multiplier circuits are primarily selected based on output voltage ($V_O$) requirements, and input voltage ($V_I$) and source voltage ($V_S$) magnitude, as well as component cost and size constraints. Selection of the capacitance values may also be based on AC signal frequency and magnitude. Additionally, the switching speed, and particularly the reverse recovery time, of all of the diodes in the circuit, especially diode D1, is preferably as fast as possible, i.e., typically less than 50 ns, due to the narrow pulse width of voltage signal $V_I$—otherwise some of the pulse voltage may be lost with a lower resulting output voltage and reduced efficiency.

One aspect of the power circuit 12 of the present invention which differs from conventional power supply circuits is the resistivity of the circuit. As discussed above, conventional step-up converter circuits are used in high-voltage power supplies for their low resistance in order to minimize the switching losses undergone by the power supply due to the conduction losses of the switching transistor. As such, the switching transistor used in conventional converter circuits is usually a MOSFET having a relatively low resistance rating (i.e., typically less than 1 ohm). Power circuit 12 of the present invention, instead, employs a transistor Q1 which has a much higher resistance rating (i.e., at least about 5 ohms and more typically in the range from about 10 to about 30 ohms). Here, transistor Q1 is depicted as a MOSFET but may be any high-resistance switch device (e.g., a BJT, IGBT, and other similar components, etc.). While this topology does not minimize conductive losses, the associated stray capacitance of the switch is significantly lower. This significantly lower stray capacitance (typically about 3-4 picofarads) allows a very high voltage gain across inductor L1 when Q1 switches off. Typical capacitance of lower resistance switches of the prior art can be as high as 100 picofarads, which can significantly affect the maximum voltage gain obtainable from an inductor.

Another feature of the power circuit 12 of the present invention which differs from conventional power supply circuits is the relatively low switching frequency of the circuit. As discussed above, conventional step-up converter circuits are used in high-voltage power supplies for their high switching frequencies (i.e., 200 kHz to 2 MHz) in order to reduce the size of the magnetic components, i.e., the inductor or transformer. Conversely, power circuit 12 of the present invention employs a transistor Q1 which is being operated at a much lower switching frequency (i.e., less than about 30 kHz, and even lower than about 20 kHz).

Each of the circuit/component features of the subject power supplies which has been discussed herein individually contributes to a reduced form-fit, whether in volume, mass and/or weight. Their integration and collective use, however, enables a further reduction in power supply size where this additional size-reduction is non-linear, i.e., the size of the whole is less the size of the sum of the individual components that would be expected using other circuit topologies. For example, the high-resistance "boost" circuit of the present invention (which allows for sufficient step-up voltage production in the inductor without the switching losses experienced by prior art boost circuits) does not require the additional stages in the multiplier circuit (if at all) that would otherwise be necessary with a low-resistance boost circuit having greater stray capacitance across the switch. Fewer multiplier stages mean fewer components which, in turn, reduce the size, weight and cost of the power supply. The subject power supplies have structures that, depending on the output voltage requirements of the application at hand, may have volumes less than about 2000 mm$^3$, and more typically less than about 1000 mm$^3$, and even less than about 300 mm$^3$, and weigh less than about 4 g, and more typically less than about 1 g, and even less than about 500 mg.

Figure 2:
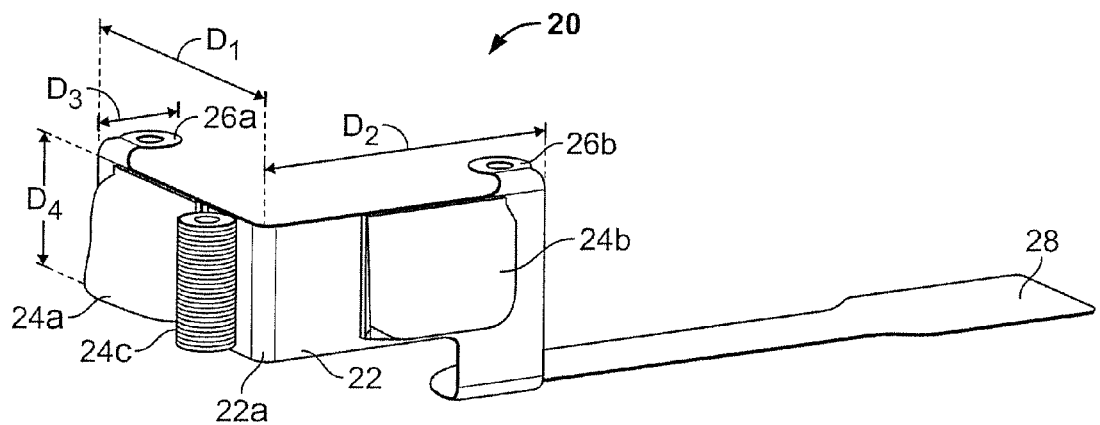
FIG. 2 is a perspective view of a power supply of the present invention having an ultra-miniature architecture.
Figure 3A:
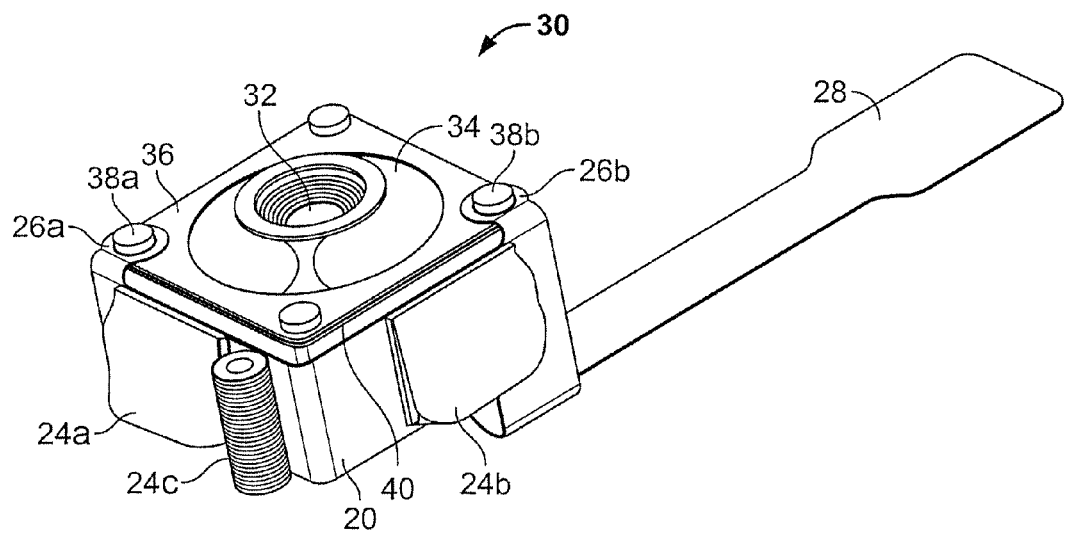
FIGS. 3A-3D are top perspective, bottom perspective, top and side views, respectively, of a camera lens module having the power supply of FIG. 2 integrated therewith.
Figure 3B:
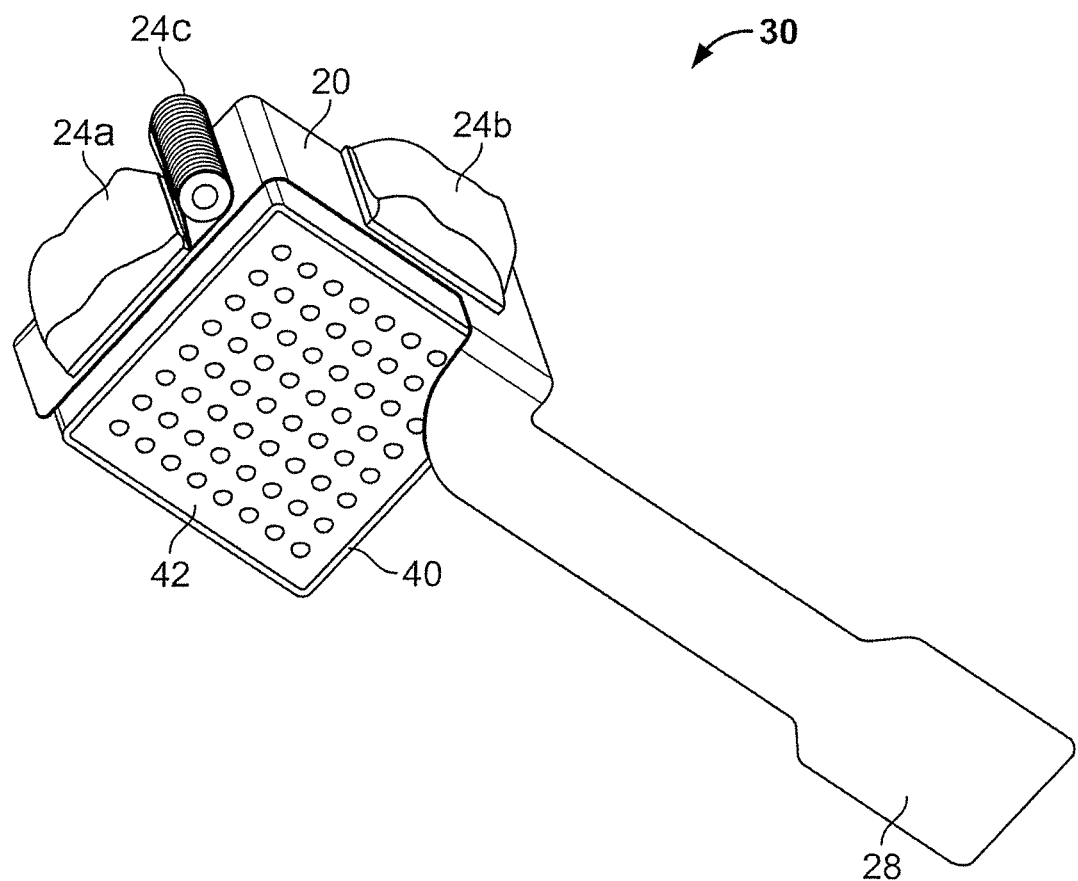
Figure 3C:
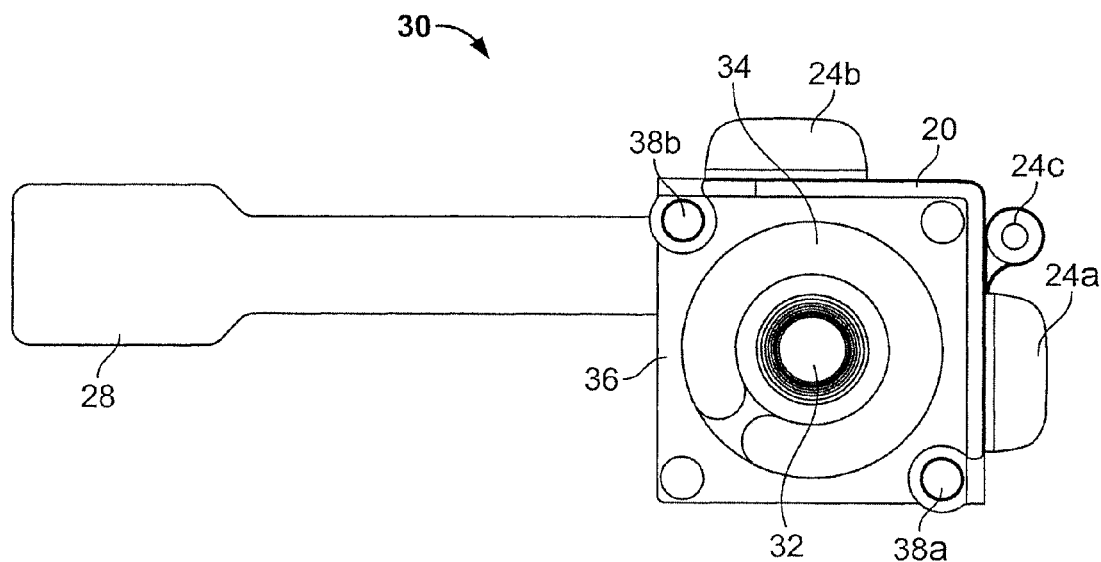
Figure 3D:
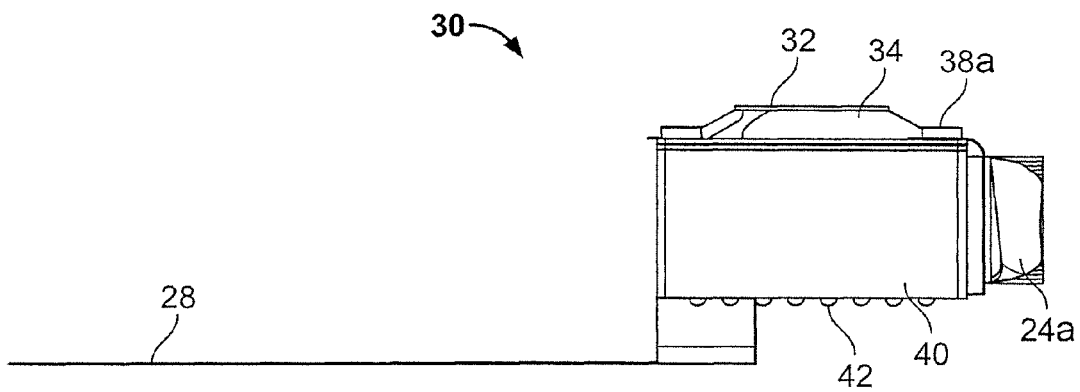

FIG. 2 illustrates one exemplary architecture in which the subject power supplies may be provided. With the minimal number of necessary components (with minimal size and weight) used to construct the subject circuitry, a power supply of the present invention may be provided within a flex circuit assembly 20, which includes a flex circuit 22 upon which the power components 24a, 24b, 24c are mounted. The power components may be integrated into one or more "potted" circuits 24a, 24b (e.g., a boost converter circuit and a multiplier circuit, respectively) for fixation to circuit 22. Other discrete components, such as inductor 24c, may also be mounted to the flex circuit. Flex circuit 22 may also be configured with conductive leads 26a, 26b or connectors 28 for electrical coupling to the high voltage and ground sides of the device to be powered and to the DC source voltage, respectively. As its name implies, flex circuit 22 is flexible and may be bent or shaped into a selected form fit to accommodate, e.g., contact, wrap around, encase, etc., the device (now shown) being powered in a contoured or flush manner so as to minimize space requirements. For example, here flex circuit 22 is provided in a narrow rectangular configuration and has been bent crosswise 22a to its length to form a substantially right angle to accommodate, for example, a corner of a device (not shown) which it is to power.

The actual size and weight of the subject power supplies depend on various factors, including the magnitude of the source voltage and the necessary voltage step-up required to power the high-voltage device, which may affect the size of the individual components discussed above. For example with a voltage input (i.e., a source voltage) of 0 to about 5V and an output voltage of about 1.25 kV, the necessary size of the power supply components employed may yield a power supply architecture having the following exemplary dimensions: with reference to FIG. 2, length dimensions ($D_1$ and $D_2$) less than about 10 mm, width dimensions (D3) less than about 2.5 mm, and height dimensions less than about 5 mm. Of course, the total volume occupied by the power supply is in part dependent on how compact assembly 20 is made to be, i.e., by wrapping or folding of the flex circuit to a minimal profile. With the dimensions provided, power supply architecture volumes of less than about 250 $mm^3$ (10 mm×2.5 mm×5 mm×2) may be realized. Further, the subject power supplies may be designed to weigh less than about 330 mg. Of course, even smaller sizes and weights may be realized for power supplies having lower input and output voltages requirements as smaller and lighter switching and magnetic components of the power supply may be employed. In this way, the power circuitry of the present invention enables power supply manufacturers to somewhat proportionately scale the size and weight of the supply to the necessary voltage requirements.

The subject power supplies are well-suited for powering high-voltage capacitive loads which themselves employ a miniature architecture. In one variation, the subject power supplies are particularly configured to power High-voltage devices employing an EAP transducer. Because of their light weight and few components, EAP transducers offer a very low profile and are ideal for use in very small scale applications. Generally, these transducers comprise two thin film electrodes having elastic characteristics and separated by a thin elastomeric dielectric polymer (e.g., made of acrylic, silicone, or the like). When a voltage difference is applied across the oppositely-charged electrodes, the electrodes attract each other thereby compressing the polymer dielectric layer therebetween. As the electrodes are pulled closer together, the dielectric polymer film becomes thinner (the z-axis component contracts) as it expands in the planar directions (the x- and y-axes components expand). Furthermore, the like (same) charge distributed across each elastic film electrode causes the conductive particles embedded within that electrode to repel one another, thereby contributing to the expansion of the elastic electrodes and dielectric films. Current EAP architectures include actuators, motors, transducers, sensors, pumps, and generators. Actuators, motors and pumps are enabled by the action discussed above. Generators are enabled by reversing the action described above, and sensors are enabled by virtue of changing capacitance upon physical deformation of the material. Examples of EAP devices and their applications are described in U.S. Pat. Nos. 7,224,106; 7,211,937; 7,199,501; 7,166,953; 7,064,472; 7,062,055; 7,052,594; 7,049,732; 7,034,432; 6,940,221; 6,911,764; 6,891,317; 6,882,086; 6,876,135; 6,812,624; 6,809,462; 6,806,621; 6,781,284; 6,768,246; 6,707,236; 6,664,718; 6,628,040; 6,586,859; 6,583,533; 6,545,384; 6,543,110; 6,376,971 and 6,343,129; and U.S. Published Patent Application Nos. 2006/0208610; 2006/0208609; 2005/0157893; and 2003/0214199, the entireties of which are incorporated herein by reference.

FIGS. 3A-3D illustrate use of a subject power supply integrated within the flex circuit assembly 20 of FIG. 2 with a cell phone camera lens module 30. Module 30 includes a housing 40 which encases a lens 32 and a lens positioner for adjusting the focal length of lens 32 to provide auto-focusing capability. An image sensor 42 is provided on the bottom or underside of module 30. The lens positioner includes an EAP actuator which, as discussed above, is a capacitive component. The actuator includes electroactive film 34 held by a frame 36 which is mounted to housing 40. Bolts 38a and 38b mechanically couple housing 40 to flex circuit assembly 20 and also electrically couple the high voltage and ground contacts (not shown) of the actuator to the high voltage and ground leads 26a and 26b, respectively, of flex circuit assembly 20. While flex circuit assembly 20 in the illustrated embodiment is positioned around the side walls of module housing 40 such that the power components (24a, 24b, 24c) face outward, assembly 20 may alternatively be mounted to housing 40 with the power components facing inward. In the latter variation, the back or bottom side of flex circuit may define at least a portion of the module housing structure, thereby providing a flush exterior. With either configuration, the assignee hereof has fabricated a camera cell phone module with a power supply of the present invention integrated therewith having an architecture volume no greater than about 650 $mm^3$, weighing less than about 2 g and having a power consumption less than about 100 mW.

The present invention also provides methods associated with the subject power circuit for powering high-voltage devices. The methods may all comprise the act of providing a suitable power supply, circuit, etc. Such provision may be performed by the end user. In other words, the act of "providing" merely requires the end user obtain, access, approach, position, set-up, activate, power-up or otherwise act to provide the requisite object used in the subject method.

As for other details of the present invention, such as the types of devices that may be powered by the subject power circuits/supplies, many such devices are generally known or appreciated by those with skill in the art. The same may hold true with respect to method-based aspects of the invention in terms of additional acts as commonly or logically employed.

The invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. Any number of the individual components, subassemblies or circuits shown may be integrated in their design. Such changes or others may be undertaken or guided by the principles of design for assembly. In addition, where a range of values is provided, it is understood that every intervening value, between the upper and lower limit of that range and any other stated or intervening value in that stated range is encompassed within the invention.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in the appended claims, the singular forms "a," "an," "said," and "the" include plural referents unless the specifically stated otherwise. In other words, use of the articles allow for "at least one" of the subject item in the description above as well as the claims below. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth in the claims. Stated otherwise, unless specifically defined herein, all technical and scientific terms used herein are to be given as broad a commonly understood meaning as possible while maintaining claim validity.

In all, the breadth of the present invention is not to be limited by the examples provided.

That being said, we claim:

1. A power circuit for stepping up a lower DC source voltage to a higher DC output voltage, the circuit comprising:
   a magnetic component; and
   a switching component for charging and discharging the magnetic component, wherein the switching component has a resistance of at least about 5 ohms;
   wherein the power circuit is configured to drive a high-voltage capacitive load coupled to at least one of the magnetic component or the switching component, wherein the high voltage capacitive load comprises an electroactive polymer.

2. The power circuit of claim 1, wherein the resistance of the switching component is at least 10 ohms.

3. The power circuit of claim 1, wherein the magnetic component is an inductor and switching component is a transistor.

4. The power circuit of claim 1, wherein the voltage gain of the circuit is at least about 100×.

5. The power circuit of claim 1, wherein the circuit defines a structure having a volume of less than about 2000 $mm^3$.

6. The power circuit of claim 5, wherein the circuit defines a structure having a volume of less than about 1000 $mm^3$.

7. The power circuit of claim 6, wherein the circuit defines a structure having a volume of less than about 300 $mm^3$.

8. The power circuit of claim 1, wherein the circuit defines a structure weighing less than about 4 g.

9. The power circuit of claim 8, wherein the circuit defines a structure weighing less than about 1 g.

10. The power circuit of claim 9, wherein the circuit defines a structure weighing less than about 500 mg.

11. The power circuit of claim 1, further comprising a voltage multiplier circuit coupled to an output of the magnetic component.

12. The power circuit of claim 11, wherein the voltage multiplier circuit is a first voltage multiplier circuit and the power circuit further comprising a second voltage multiplier circuit coupled to the first voltage multiplier circuit.

13. The power circuit of claim 1, wherein the electroactive polymer forms a part of a lens positioner.

14. The power circuit of claim 1, wherein the switching component has a switching frequency less of than about 30 kHz.

15. The power circuit of claim 1, wherein the magnetic component comprises an inductor or a transformer.

16. The power circuit of claim 1, wherein the switching component comprises a transistor.

17. The power circuit of claim 16, wherein the transistor that has a resistance of between about 10 and 30 ohms.

18. The power circuit of claim 1, further comprising an oscillator connected to the switching component.

19. The power circuit of claim 1, further comprising a diode coupled to the switching component, and wherein an orientation of the diode is such that the diode cannot conduct current while the switching component is on.

20. The power circuit of claim 1, wherein the switching component has a switching frequency less of than about 20 kHz.

* * * * *